United States Patent
Wang et al.

(10) Patent No.: US 9,850,375 B2
(45) Date of Patent: *Dec. 26, 2017

(54) RESIN COMPOSITION, COPPER CLAD LAMINATE AND PRINTED CIRCUIT BOARD USING SAME

(71) Applicant: ELITE ELECTRONIC MATERIAL (KUNSHAN) CO. LTD, Jiangsu Province (CN)

(72) Inventors: Rongtao Wang, Jiangsu Province (CN); Yu-Te Lin, Hsien (TW); Wenjun Tian, Jiangsu Province (CN); Ziqian Ma, Jiangsu Province (CN); Wenfeng Lv, Jiangsu Province (CN); Ningning Jia, Jiangsu Province (CN)

(73) Assignee: ELITE ELECTRONIC MATERIAL (KUNSHAN) CO. LTD., Kunshan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/411,166

(22) PCT Filed: Aug. 23, 2013

(86) PCT No.: PCT/CN2013/082192
§ 371 (c)(1),
(2) Date: Dec. 24, 2014

(87) PCT Pub. No.: WO2015/024256
PCT Pub. Date: Feb. 26, 2015

(65) Prior Publication Data
US 2016/0222204 A1    Aug. 4, 2016

(51) Int. Cl.
| | | |
|---|---|---|
| C08L 63/00 | (2006.01) |
| B32B 15/092 | (2006.01) |
| B32B 15/14 | (2006.01) |
| B32B 15/20 | (2006.01) |
| B32B 5/02 | (2006.01) |
| B32B 15/08 | (2006.01) |
| B32B 37/06 | (2006.01) |
| B32B 37/12 | (2006.01) |
| C08G 59/50 | (2006.01) |
| C08G 59/54 | (2006.01) |
| C08G 59/56 | (2006.01) |
| C08G 59/62 | (2006.01) |
| C08L 79/02 | (2006.01) |
| C08J 5/24 | (2006.01) |
| H05K 1/03 | (2006.01) |
| H05K 1/09 | (2006.01) |
| C09D 163/00 | (2006.01) |
| C09D 179/02 | (2006.01) |
| C08K 3/32 | (2006.01) |

(Continued)

(52) U.S. Cl.
CPC ........... *C08L 63/00* (2013.01); *B32B 5/02* (2013.01); *B32B 15/092* (2013.01); *B32B 15/14* (2013.01); *B32B 15/20* (2013.01); *C08G 59/245* (2013.01); *C08G 59/50* (2013.01); *C08G 59/504* (2013.01); *C08G 59/54* (2013.01); *C08G 59/56* (2013.01); *C08G 59/621* (2013.01); *C08J 5/24* (2013.01); *H05K 1/0353* (2013.01); *H05K 1/09* (2013.01); *B32B 2260/021* (2013.01); *B32B 2262/101* (2013.01); *B32B 2307/3065* (2013.01); *B32B 2457/08* (2013.01); *C08J 2363/00* (2013.01); *C08J 2363/02* (2013.01); *C08J 2363/10* (2013.01); *C08J 2471/10* (2013.01); *C08J 2479/02* (2013.01); *C08L 2201/02* (2013.01); *C08L 2203/206* (2013.01); *C08L 2205/03* (2013.01); *H05K 2201/012* (2013.01)

(58) Field of Classification Search
CPC .......... C08L 63/00–63/10; C08L 79/02; C09D 163/00–163/10; C09J 163/00–163/10; C09J 179/02; C08D 179/02; C08J 2479/02; C08J 5/24; C08J 2363/00–2363/10; C08G 59/50; C08G 59/621; H05K 1/09; H05K 1/0353; B32B 15/092; B32B 15/20; B32B 15/14; B32B 5/02

See application file for complete search history.

(56) References Cited

U.S. PATENT DOCUMENTS

2006/0160931 A1* 7/2006 Jung ................. B32B 15/08
523/427
2007/0203308 A1* 8/2007 Mori ................. C08G 59/38
525/524

(Continued)

FOREIGN PATENT DOCUMENTS

CN    1088727 C    8/2002
CN    101696317 A    4/2010

(Continued)

OTHER PUBLICATIONS

Machine translation of JP 2001220455 A.*

(Continued)

*Primary Examiner* — Kregg T Brooks
(74) *Attorney, Agent, or Firm* — Kilpatrick Townsend & Stockton LLP

(57) ABSTRACT

The present invention provides a resin composition comprising: (A) 100 parts by weight of epoxy resin; (B) from 10 to 80 parts by weight of benzoxazine resin; (C) from 10 to 50 parts by weight of dicyclopentadiene phenol resin; and (D) from 0.5 to 5 parts by weight of amine hardener; wherein the resin composition is free of diallyl bisphenol A (DABPA).

15 Claims, No Drawings

(51) Int. Cl.
*C08K 5/03* (2006.01)
*C08K 5/3415* (2006.01)
*C08K 5/3492* (2006.01)
*C08K 5/49* (2006.01)
*C08G 59/24* (2006.01)

(56) References Cited

U.S. PATENT DOCUMENTS

| | | | | |
|---|---|---|---|---|
| 2009/0104429 A1* | 4/2009 | Goto | ............... | B32B 27/06 428/319.3 |
| 2010/0048766 A1* | 2/2010 | Cheng | ............. | C08G 59/4261 523/451 |
| 2013/0316155 A1* | 11/2013 | Li | ............. | C08L 63/00 428/209 |
| 2014/0322541 A1* | 10/2014 | Wang | ............. | C08L 63/04 428/418 |

FOREIGN PATENT DOCUMENTS

| | | |
|---|---|---|
| CN | 103182831 | 7/2013 |
| JP | 2001220455 A * | 8/2001 |

OTHER PUBLICATIONS

Nippon Kayaku Co., Ltd., Thermosetting Resins, 8th ed. (no date).*
DIC Corporation, EPICLON Standard Products (2013).*

* cited by examiner

RESIN COMPOSITION, COPPER CLAD LAMINATE AND PRINTED CIRCUIT BOARD USING SAME

TECHNICAL FIELD

The present invention relates to a resin composition, particularly relates to a resin composition used for copper clad laminates and printed circuit boards.

BACKGROUND

It is known in the art that DICY has the disadvantages of low Tg and poor heat resistance of laminate (measured by DSC, Tg=140° C.) during PCT when it is used as a hardening agent for epoxy resin.

It is known in the art that Benzoxazine (Bz) resin is used as a hardening agent for epoxy resin. But Benzoxazine resin requires a co-hardening agent to open the benzoxazine ring and then crosslink with an epoxy resin. CN1088727C by HITACHI KASEI IND CO LTD teaches the synergistic effect of phenolic resin and Bz resin. However, the use of phenolic resin results in too high dielectric properties (Dk about 4.4, Df about 0.014@2 GHz) and is impossible to meet the regulation requirement of a low dielectric copper clad laminate.

In order to attain low dielectric properties of a copper clad laminate (Dk≤4.1, Df≤0.01@2 GHz). In the prior art people generally uses expensive cyanate ester resins. The cost of the material for making cyanate ester resins is about more than 8 times of epoxy resin. Thus the product is not competitive due to high cost.

In summary, there is no resin composition that can attain low dielectric properties and high laminate heat resistance without using cyanate ester resin in the art.

Therefore, there is an urgent need for a resin composition that can attain low dielectric properties and high laminate heat resistance without using cyanate ester resin.

SUMMARY OF THE INVENTION

The first object of the present invention is: in order to overcome the disadvantage on cost, the present discloses a resin composition that can attain low dielectric properties and high laminate heat resistance without using cyanate ester resin.

The second object of the present invention is to provide a prepreg using the present resin composition.

The third object of the present invention is to provide a copper clad laminate using the present resin composition.

The fourth object of the present invention is to provide a printed circuit board using the present resin composition.

In the first aspect, the present invention provides a resin composition comprising:

(A) 100 parts by weight of epoxy resin;

(B) from 10 to 80 parts by weight of benzoxazine resin;

(C) from 10 to 50 parts by weight of dicyclopentadiene phenol resin; and (D) from 0.5 to 5 parts by weight of amine hardener;

wherein the resin composition is free of diallyl bisphenol A (DABPA).

In an embodiment of the present invention, the dicyclopentadiene phenol resin is selected from the compound represented by the following structural formula:

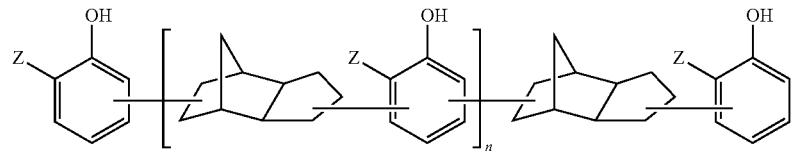

wherein n is a positive integer from 1 to 5, Z is selected from —H, —CH$_3$ or a combination thereof.

In an embodiment of the present invention, the amine hardener is at least one selected from the group consisting of diamino diphenylsulfone, diamino diphenylmethane, diamino diphenyl ether, diamino diphenyl sulfide and dicyandiamide.

In a preferred embodiment of the present invention, the amine hardener is dicyandiamide (dicy).

In an embodiment of the present invention, the epoxy resin is at least one selected from the group consisting of bisphenol A epoxy resin, bisphenol F epoxy resin, bisphenol S epoxy resin, bisphenol AD epoxy resin, bisphenol A novolac epoxy resin, o-cresol novolac epoxy resin, trifunctional epoxy resin, tetrafunctional epoxy resin, dicyclopentadiene type epoxy resin, DOPO-containing epoxy resin, DOPO-HQ-containing epoxy resin, p-xylene epoxy resin, naphthalene type epoxy resin, benzopyran type epoxy resin, biphenyl novolac epoxy resin, isocyanate modified epoxy resin, phenol benzaldehyde epoxy resin and phenol aralkyl novolac epoxy resin.

In an embodiment of the present invention, the benzoxazine resin is at least one selected from the group consisting of bisphenol A type benzoxazine resin, bisphenol F type benzoxazine resin, diamino diphenyl ether type benzoxazine resin and phenolphthalein type benzoxazine resin.

In an embodiment of the present invention, the composition further comprises from 30 to 70 parts by weight of flame retardant, wherein the flame retardant is at least one selected from the halogen-free flame retardants and halogen flame retardants: bisphenol diphenyl phosphate, ammonium polyphosphate, hydroquinone-bis-(diphenyl phosphate), bisphenol A-bis-(diphenylphosphate), tris(2-carboxyethyl) phosphine, tris(isopropylchloro)phosphate, trimethyl phosphate, dimethyl methyl phosphonate, resorcinol bis(dixylenyl phosphate), phosphazene, m-phenylene methylphosphonate, melamine polyphosphate, melamine cyanurate and tri-hydroxyethyl isocyanurate, 9,10-dihydro-9-oxa-10-phosphaphenanthrene-10-oxide (DOPO), DOPO-containing phenol resin, ethyl-bis(tetrabromophthalimide), ethane-1,2 bis(pentabromobenzene) and 2,4,6-tris(2,4,6-tribromophenoxy)-1,3,5-triazine.

In an embodiment of the present invention, the flame retardant can be mixed with other components, or cross-linked to the epoxy resin of component (A) or other resins by a chemical method. For example, 9,10-dihydro-9-oxa-10-phosphaphenanthrene-10-oxide (DOPO) can be cross-linked to the epoxy resin to form DOPO-containing epoxy resin.

The second aspect of the present invention provides a prepreg comprising the resin composition of the present invention.

The third aspect of the present invention provides a copper clad laminate comprising the prepreg of the present invention.

The fourth aspect of the present invention provides a printed circuit board comprising the copper clad laminate of the present invention.

DETAILED DESCRIPTION OF THE INVENTION

The inventors discover a resin composition that can attain low dielectric properties and high laminate heat resistance without using cyanate ester resins through extensive and intensive study. Thus, the amount of cyanate ester is reduced or even no cyanate ester is used. The inventors complete the invention based on this study.

The present invention can meet the requirement of low dielectric properties and high heat resistance without using cyanate ester resin in consideration of reducing cost. But the present invention does not intent to exclude cyanate ester resin from the formulation.

As used herein, the terms "comprises," "comprising," "includes," "including," "has," "having" and any other variation thereof are intended to cover a non-exclusive inclusion. For example, a composition or article of manufacture that comprises a list of elements is not necessarily limited to only those elements but may include other elements not expressly listed or inherent to such composition or article of manufacture. Therefore, the terms "comprises," "comprising," "includes," "including," "has," and "having" indicate that various components may be used collectively in the mixture or composition of this invention. On the other hand, the terms "consisting essentially of" and "consisting of" include only the named components as well as other non-essential components which do not significantly affect the uses and effects of the present invention.

The inventive concept of the present invention is that:

The present invention uses benzoxazine, dicyclopentadiene phenol resin and amine hardener as the hardening agent for epoxy resin and is free of diallyl bisphenol A. The resin composition of the present invention has low dielectric properties and high laminate heat resistance due to the synergistic effect between the epoxy resin and the three hardeners.

Hereinafter, the aspects of the present invention will be described in detail:

SUMMARY

The present invention provides a resin composition, which comprises:
(A) 100 parts by weight of epoxy resin;
(B) from 10 to 80 parts by weight of benzoxazine resin;
(C) from 10 to 50 parts by weight of dicyclopentadiene phenol resin; and
(D) from 0.5 to 5 parts by weight of amine hardener;
wherein the resin composition is free of diallyl bisphenol A (DABPA).

The present invention makes use of the synergistic effect among resin component (A) epoxy resin, resin component (B) benzoxazine resin, resin component (C) dicyclopentadiene phenol resin and resin component (D) amine hardener, thereby obtaining a resin composition having low dielectric properties and high laminate heat resistance. The above resin components are required to comprise no diallyl bisphenol A (DABPA). Otherwise, the laminate heat resistance (T288) is likely to become worse.

Resin Component (A): Epoxy Resin

As mentioned above, the present application uses resin component (A) epoxy rein, the first hardener component (B) benzoxazine resin, the second hardener component (C) dicyclopentadiene phenol resin and the third hardener component (D) amine hardener as the resin ingredients and makes use of the synergistic effect among them to attain low dielectric properties and high laminate heat resistance.

Generally, traditional epoxy resin is synergistic with other components. There should thus be no specific limitation to the epoxy resin so long as it will not limit the purpose of the present invention.

In the resin composition of the present invention, the component (A) epoxy resin is bisphenol A epoxy resin, bisphenol F epoxy resin, bisphenol S epoxy resin, bisphenol AD epoxy resin, bisphenol A novolac epoxy resin, o-cresol novolac epoxy resin, trifunctional epoxy resin, tetrafunctional epoxy resin, dicyclopentadiene type epoxy resin, DOPO-containing epoxy resin, DOPO-HQ-containing epoxy resin, p-xylene epoxy resin, naphthalene type epoxy resin, benzopyran type epoxy resin, biphenyl novolac epoxy resin, isocyanate modified epoxy resin, phenol benzaldehyde epoxy resin, phenol aralkyl novolac epoxy resin or the combination thereof. DOPO epoxy resin can be DOPO-PN epoxy resin, DOPO-CNE epoxy resin, DOPO-BPN epoxy resin and DOPO-HQ epoxy resin can be DOPO-HQ-PN epoxy resin, DOPO-HQ-CNE epoxy resin or DOPO-HQ-BPN epoxy resin.

The First Hardener: Component (B) Benzoxazine Resin

The present invention makes full use of the synergistic effect of these three hardeners. Particularly, in the resin composition of the present invention, the component (B) benzoxazine resin is bisphenol A type benzoxazine resin, bisphenol F type benzoxazine resin, diamino diphenyl ether type benzoxazine resin, or phenolphthalein type benzoxazine resin or a combination thereof. More particularly, it is preferably at least one selected from the following general formulas (1) to (3):

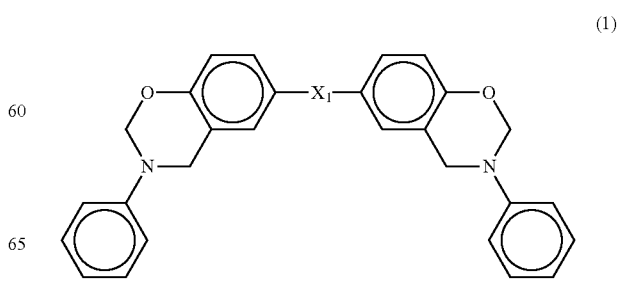

-continued

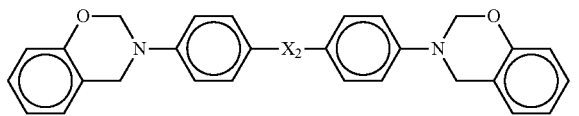
(2)

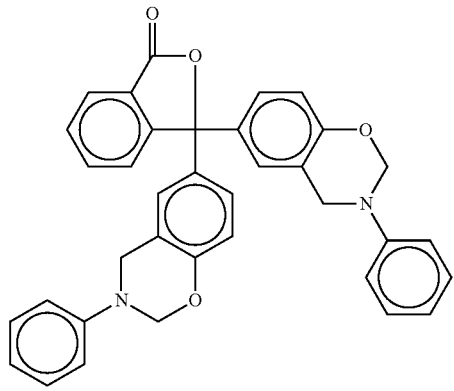
(3)

wherein $X_1$ and $X_2$ are each independently R or Ar or —$SO_2$—; wherein R is selected from —$C(CH_3)_2$—, —CH($CH_3$)—, —$CH_2$— and unsubstituted or substituted dicyclopentadienyl; and Ar is selected from unsubstituted or substituted phenyl, biphenyl, naphthyl, phenolic aldehyde, bisphenol A, bisphenol A novolac, or bisphenol F functional groups. For example, the benzoxazine resins are those commercially available from Huntsman under the trade name LZ-8270, LZ-8280, LZ-8290, MT 35700, MT 35800.

In an embodiment of the present invention, the benzoxazine resin is at least one selected from the group consisting of: bisphenol A type benzoxazine resin, bisphenol F type benzoxazine resin, diamino diphenyl ether type benzoxazine resin and phenolphthalein type benzoxazine resin.

The resin composition of the present invention comprises from 10 to 80 parts by weight of added benzoxazine resin based on 100 parts by weight of epoxy resin. Adding benzoxazine resin in this range allows the resin composition to have the desired low dissipation factor (Df). If the amount of benzoxazine resin is less than 10 parts by weight, the desired low dissipation factor value cannot be attained; if the amount exceeds 80 parts by weight, the laminate made by the resin composition will have poor heat resistance.

The Second Hardener: Component (C) Dicyclopentadiene Phenol Resin

The resin composition of the present invention comprises from 10 to 50 parts by weight of added dicyclopentadiene phenol resin based on 100 parts by weight of epoxy resin. Adding dicyclopentadiene phenol resin in this range allows the resin composition to have desired low dielectric constant value (Dk). If the amount of dicyclopentadiene phenol resin is less than 10 parts by weight, the desired low dielectric constant value cannot be attained and the laminate heat resistance will be lowered (T288, Tg); if the amount exceeds 50 parts by weight, the glass transition temperature (Tg) of the laminate made by the resin composition will be reduced.

The resin composition of the present invention preferably comprises from 10 to 40 parts by weight of added dicyclopentadiene phenol resin based on 100 parts by weight of epoxy resin.

Exclusion of Diallyl Bisphenol A (DABPA) from the Hardener Components

The hardener composition does not comprise diallyl bisphenol A (DABPA).

The inventors has discovered in previous experiments that adding diallyl bisphenol A (DABPA) in epoxy resin can make the resin composition have good crosslinking properties, increased Tg and increased peeling strength between the resin and the copper foil.

However, through further experiments, the inventors surprisingly discover that, instead, removing diallyl bisphenol A (DABPA) and only using dicyclopentadiene phenol resin is more helpful to improve the laminate heat resistance (T288).

The Third Hardener: Component (D) Amine Hardener

In the resin composition of the present invention, the component (D) amine hardener is a compound comprising amino functional group, preferably a compound comprising diamino functional group. More particularly, the amine hardener may be diamino diphenyl sulfone, diamino diphenyl methane, diamino diphenyl ether, diamino diphenyl sulfide, and dicyandiamide (DICY) or a combination thereof. Preferably, the amine hardener may be 4,4'-diamino diphenyl sulfone, 4,4'-diamino diphenyl methane, 4,4'-diamino diphenyl ether, 4,4'-diamino diphenyl sulfide, dicyandiamide (DICY) or a combination thereof.

In an embodiment of the present invention, the amine hardener is at least one selected from the group consisting of diamino diphenyl sulfone, diamino diphenyl methane, diamino diphenyl ether, diamino diphenyl sulfide, and dicyandiamide.

More preferably, the amine hardener is dicyandiamide (DICY).

The resin composition of the present invention comprises from 0.5 to 5 parts by weight of added amine hardener based on 100 parts by weight of epoxy resin. Adding amine hardener in this range can improve the peeling strength between the resin composition and the copper foil. If the amount of amine hardener is less than 0.5 parts by weight, the desired peeling strength cannot be attained. If the amount exceeds 5 parts by weight, the hygroscopicity of the laminate made from the resin composition will be increased, resulting in delamination and failure in laminate PCT test (pressure cooker cooking test for copper-free laminate).

The resin composition of the present invention preferably comprises from 0.5 to 3 parts by weight of added amine hardener based on 100 parts by weight of epoxy resin.

Further, the resin composition of the present invention more preferably comprises from 0.5 to 3 parts by weight of added dicyandiamide based on 100 parts by weight of epoxy resin.

The Synergism of Three Components

The ratio of three hardeners is as follows:
(B) from 10 to 80 parts by weight of benzoxazine resin;
(C) from 10 to 50 parts by weight of dicyclopentadiene phenol resin; and
(D) from 0.5 to 5 parts by weight of amine hardener.

Thus, the ratio of three components is in turn (10-80):(10-50):(0.5-5). To obtain better synergism, the ratio of benzoxazine resin:dicyclopentadiene phenol resin:amine hardener is preferably 10-60:15-35:0.5-3.

As mentioned above, the inventors discover that removing diallyl bisphenol A (DABPA) and only using dicyclopentadiene phenol resin further improve the laminate heat resistance (T288).

Further, the present invention preferably uses the combination of the third hardener (D) DICY with other hardeners. It is considered in the prior art that using DICY as a hardener for epoxy resin will result in low Tg (DSC test, Tg=140° C.) and poor laminate PCT heat resistance. However, the inventors find that a better technical effect can be achieved by the synergism of the first hardener component (B) benzoxazine resin, the second hardener component (C) dicyclopentadiene phenol resin and the third hardener component (D) DICY. As shown in Example E13 of the present invention, although it also attained a good technical effect, the example using DDS was not better than that using DICY. As shown in Example 7, as the amount of DICY increased, the peeling strength also increased, and Tg met the requirement. According to Comparative Example C14 and Example E14, when diallyl bisphenol A (DABPA) was removed and dicyclopentadiene phenol resin was used, the heat resistance of the copper-clad laminate (T288) was further increased.

Other Components

In an embodiment of the present invention, the composition further comprises from 30 to 70 parts by weight of flame retardant. Said flame retardant may be selected from halogen flame retardants and also may be selected from halogen-free flame retardants.

The halogen flame retardants may be brominated flame retardants, without particular limitation, which are preferably at least one selected from the following flame retardants: ethyl-bis(tetrabromophthalimide) (for example, SAYTEX BT-93 commercially available from Albemarle), ethane-1,2 bis(pentabromobenzene) (for example, SAYTEX 8010 commercially available from Albemarle) and 2,4,6-tris (2,4,6-tribromophenoxy)-1,3,5-triazine (for example, FR-245 commercially available from ICL Industrial Company).

The halogen-free flame retardants may comprise nitrogen-containing flame retardants or phosphorus-containing flame retardants. The halogen-free flame retardants may be selectively at least one compound of, but are not limited to, the following group: bisphenol diphenyl phosphate, ammonium polyphosphate, hydroquinone-bis-(diphenyl phosphate), bisphenol A-bis-(diphenylphosphate), tris(2-carboxyethyl)phosphine (TCEP), tris(isopropylchloro) phosphate, trimethyl phosphate (TMP), dimethyl methyl phosphonate (DMMP), resorcinol bis(dixylenyl phosphate) (RDXP, such as PX-200), phosphazene (such as SPB-100), m-phenylene methylphosphonate (PMP), melamine polyphosphate, melamine cyanurate and tri-hydroxy ethyl isocyanurate. Moreover, the halogen-free flame retardants also includes 9,10-dihydro-9-oxa-10-phosphaphenanthrene-10-oxide (DOPO), phenol resin (such as DOPO-HQ, DOPO-PN, DOPO-BPN) etc., wherein DOPO-BPN may be bisphenol phenolic compounds, such as DOPO-BPAN, DOPO-BPFN, DOPO-BPSN, etc.

The resin composition of the present invention may further comprise inorganic fillers, curing accelerators, silane coupling agents, toughening agents, solvents or a combination thereof.

Adding inorganic fillers into the resin composition of the present invention is mainly used to increase the thermal conductivity of the resin composition and improve its characteristics, such as, thermal expansion and mechanical strength, etc. The inorganic fillers are preferably uniformly dispersed in the resin composition. The inorganic filler may comprises silicon dioxide (fused, non-fused, porous or hollow), aluminum hydroxide, magnesium oxide, magnesium hydroxide, calcium carbonate, boron nitride, aluminum silicon carbide, silicon carbide, titanium dioxide, zinc oxide, mica, boehmite (AlOOH), calcined talc, talc, silicon nitride, calcined kaolin. The inorganic fillers may be in the shape of sphere, fiber, plate, granule, sheet or whisker and may be optionally pretreated by silane coupling agent.

The resin composition of the present invention comprises from 10 to 150 parts by weight of added inorganic filler based on 100 parts by weight of epoxy resin. If the amount of inorganic filler is less than 10 parts by weight, there is no significant thermal conductivity and the characteristics such as thermal expansion and mechanical strength are not improved; if the amount exceeds 150 parts by weight, the flowability for filling the holes of the resin composition will deteriorate and the drill pin abrasion during the PCB drilling procedure will be increased. More particularly, the resin composition of the present invention preferably comprises from 30 to 70 parts by weigh of inorganic filler.

The curing accelerators of the present invention may comprise catalysts, such as Lewis acids or Lewis bases. The Lewis bases may include one or more of imidazole, boron trifluoride amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acids may include metal salt compounds, such as the salts of manganese, iron, cobalt, nickel, copper, zinc and the like, for example, metallic catalysts such as zinc caprylate and cobalt caprylate.

The silane coupling agents of the present invention may comprise silanes and siloxanes. According to the functional groups, the silane coupling agents may be divided into amino silanes, amino siloxanes, epoxy silanes and epoxy siloxanes.

The toughening agents of the present invention are selected from the additives comprising rubber resin, carboxy-terminated butadiene acrylonitrile rubber (CTBN), core-shell rubber, etc.

The solvents of the present invention are those selected from menthol, ethanol, ethylene glycol monomethyl ether, acetone, butanone (methyl ethyl ketone), methyl isobutyl ketone, cyclohexanone, toluene, xylene, methoxy ethyl acetate, ethoxy ethyl acetate, proproxy ethyl acetate, ethyl acetate, dimethyl formamide, propylene glycol methyl ether or a combination thereof.

The resin composition of the present invention may further comprise one or a combination of the following resins: polyphenylene ether resins, cyanate ester resins, isocyanate ester resins, maleimide resins, polyester resins, styrene resins, butadiene resins, phenoxy resins, polyamide resins and polyimide resins.

Prepreg

The present invention provides a prepreg comprising the composition according to the present invention.

Another object of the present invention is to disclose a prepreg that has low dielectric constant, low dissipation factor, heat resistance and flame retardancy. Accordingly, the prepreg disclosed in the present invention may comprise a reinforcing material and the resin composition described above, wherein the resin composition adheres to the reinforcing material by ways of immersing, etc. and becomes a semi-cured state upon heating at high temperature. The reinforcing material may be fiber materials, woven fabrics and non-woven fabrics, such as glass fiber fabrics, which can increase the mechanical strength of the prepreg. In addition, the reinforcement may be optionally pretreated by silane coupling agent or siloxane coupling agent, for example, the glass fiber fabrics pretreated by silane coupling agent.

Said prepreg may be cured by heating at high temperature and/or high pressure to form a cured film or a solid insulation layer and the solvent existed in the resin composition, if any, will evaporate during the heating at high temperature.

Copper Clad Laminate

The present invention provides a copper clad laminate comprising the semi-cured prepreg according to the present invention.

Another object of the present invention is to disclose a copper clad laminate that has low dielectric property, heat resistance and flame retardancy and is particularly suitable for high speed and high frequency signal transmission circuit board. Accordingly, the present invention provides a copper clad laminate comprising two or more copper foils and at least one insulation layer, wherein the copper foils may further comprise an alloy of copper with at least one metal of aluminum, nickel, platinum, silver, gold and the like; the insulation layer is formed by curing said semi-cured prepreg under high temperature and high pressure, for example, laminating said semi-cured prepreg between two copper foils under high temperature and high pressure.

The copper clad laminate of the present invention has at least one of the follow advantages: low dielectric constant and low dissipation factor, superior heat resistance and flame retardancy. The copper clad laminate may be further processed by producing line and the like to form a circuit board. The circuit board can be operated under harsh environment, for example, high temperature or high water absorption resistance etc., after incorporated into electronic components without deteriorating its quality.

Printed Circuit Board

The present invention provides a printed circuit board comprising the copper clad laminate according to the present invention.

Another object of the present invention is to provide a printed circuit board that has low dielectric property, heat resistance and flame retardancy and is particularly suitable for high speed and high frequency signal transmission. The circuit board comprises at least one said copper clad laminate and the circuit board may be prepared by known processes.

Unless specified, all materials of the present invention were commercially available or prepared by conventional process in the art. Unless defined or specified otherwise, all technical and scientific terms used herein have the same meanings as commonly understood by the skilled in the art. Any methods and materials similar or equivalent to those described herein can also be used in the process of the present invention.

Based on the contents disclosed herein, other aspects of the present invention are obvious for the skilled in the art.

Hereinafter, the present invention will be further described by way of the following examples. It should be understood that these examples only intend to describe the invention, but not to limit the scope of the present invention. In the following examples, for the experimental methods in which specific conditions were not indicated, they were usually conducted in accordance with the national standards. If there are no corresponding national standards, they were conducted in accordance with common international standards, conventional conditions or conditions suggested by the manufacturers. Unless specified otherwise, all parts and percentage are by weight and the molecular weight of the polymers is number average molecular weight.

Examples 1-14 and Comparative Examples 1-14

SEC-365: isocyanate-modified epoxy resin, purchased from Shin-A Corporation;
EXA-9900: naphthalene ring-containing epoxy resin, purchased from Dainippon Ink Chemicals Inc. (D.I.C.);
HP-7200H: dicyclopentadiene phenol epoxy resin, purchased from Dainippon Ink Chemicals Inc. (D.I.C.);
NC-3000: biphenyl epoxy resin, purchased from Nippon Kayaku Co. Ltd.;
LZ 8280: bisphenol F type benzoxazine resin, purchased from Huntsman Corporation;
MT 35700: bisphenol A type benzoxazine resin, purchased from Huntsman Corporation;
MT 35800: phenolphthalein type benzoxazine resin, purchased from Huntsman Corporation;
PF-3500: diamino diphenyl ether type benzoxazine resin, purchased from Changchun resin Corporation;
PD-9110: dicyclopentadiene phenol resin, purchased from Changchun plastics Corporation;
Dicy: dicyandiamide, purchased from Kingyorker Enterprise Co. Ltd.;
DDS: 4,4-diaminodiphenyl sulfone, purchased from Atul LTD;
SPB-100: phosphazene, purchased from Otsuka Chemical Co. Ltd.;
XZ92741: phosphorus-containing flame retardant, purchased from Dow Chemical Company;
PX-200: condensed phosphate, purchased from Daihachi Chemical Corporation;
8010: ethane-1,2-bis(pentabromophenyl), purchased from Albemarle Corporation;
BT-93: ethyl-bis(tetrabromophthalimide), purchased from Albemarle Corporation;
Fused silica: fused silicon dioxide, purchased from Sibelco ASIA PTE LTD;
2PZ: 2-phenylimidazole, purchased from SHIKOKU CHEMICALS CORPORATION;
6020: aminosilane, purchased from DOW CORNING CORPORATION.

The compositions for Examples 1-14 and Comparative examples 1-14 are shown in Table 1 and Table 2. The samples of Examples 1-14 are noted as E1 to E14 and the samples of Comparative examples are noted as C1 to C14.

The resin compositions of Examples 1-14 and Comparative examples 1-14 were mixed in batches in an agitator tank and then placed into a dipping tank. The resin composition was adhered onto a glass fiber fabric by passing the glass fiber fabric through the dipping tank, then baked to semi-cured state to obtain a prepreg.

For one of the separately prepared prepreg, four prepregs were taken from the same batch and then two 18 μm copper foils were provided. They were laminated in the sequence of one copper foil, four prepregs and one copper foil and then pressed in vacuum at 200° C. for 2 hours to form a copper clad laminate. The four prepregs were cured to form an insulation layer between two copper foils.

The above copper clad laminate and the copper-free laminate after etching away copper foil were subjected to physical property measurements. The physical property measurements comprised glass transition temperature (Tg, differential scanning calorimetry), heat resistance T-288 (copper-clad laminate test, which tested the time for heating at 288° C. without delamination; the heat resistance of the copper-clad laminate at 288° C. was tested by Thermomechanical analysis (TMA) and evaluated by the time for heating without delamination, the longer the better), PCT (2 atm/3 hours) (pressure cooker cooking test on copper-free laminate, which was cooked at 121° C. for 3 hours to absorb water, subjected to solder dip test in a solder pot at 288° C. After 20 seconds, the laminate was observed whether there is delamination or not), peeling strength between the copper foil and the laminate (tested by universal tensile machine, P/S, half ounce copper foil, the higher the peeling strength between the copper foil and the laminate, the better), copper-clad laminate solder dip test (S/D, 288° C., 10 sec, heat cycles were tested), dielectric constant (Dk, the lower the better, the value of Dk of copper-free laminate was tested by AET microwave dielectric analyzer), dissipation factor (Df, the lower the better, the value of Df of copper-free laminate was tested by AET microwave dielectric analyzer), flaming test (UL94, V-0>V-1>V-2). The tested results of the resin compositions of Examples 1-14 were listed in Table 1 and those of Comparative Examples 1-14 were listed in Table 2.

TABLE 1

| Composition | | E1 | E2 | E3 | E4 | E5 | E6 | E7 | E8 | E9 | E10 | E11 | E12 | E13 | E14 |
|---|---|---|---|---|---|---|---|---|---|---|---|---|---|---|---|
| epoxy resin | SFC-365 | 50 | 50 | 50 | 50 | 50 | 50 | 50 | 50 | 50 | 50 | 50 | 50 | 50 | |
| | HP-7200H | | | | | | | | | | | | | | 40 |
| | NC-3000 | | | | | | | | | | | | | | 60 |
| benzoxazine resin | EXA-9900 | 50 | 50 | 50 | 50 | 50 | 50 | 50 | 50 | 50 | 50 | 50 | 50 | 50 | 50 |
| | LZ8280 | 60 | | | | 15 | 35 | 35 | 70 | 10 | 35 | 35 | 35 | 35 | |
| | BPF-Bz | | 60 | | | | | | | | | | | | |
| | MT 35700 BPA-Bz | | | 60 | | 20 | | | | | | | | | |
| | MT 35800 phenol-phthalein-Bz | | | | 60 | | | | | | | | | | |
| | PF-3500 | | | | | | | | | | | | | | |
| | ODA-Bz | | | | | | | | | | | | | | |
| Amine hardener | DICY | 1 | 1 | 1 | 1 | 1 | 0.5 | 1 | 1 | 3 | 1 | 1 | 1 | 1 | 1 |
| | DDS | | | | | | | | | | | | | | |
| dicyclopentadiene phenol resin | PD-9110 | 20 | 20 | 20 | 20 | 30 | 30 | 30 | 30 | 10 | 30 | 30 | 30 | 30 | 20 |
| Flame retardant | SPB-100 | 50 | 50 | 50 | 50 | 50 | 50 | 50 | 50 | 50 | 20 | 25 | 25 | 50 | 40 |
| | XZ92741 | | | | | | | | | | 25 | 25 | 25 | | |
| | PX-200 | | | | | | | | | | | | | | |
| | 8010 | | | | | | | | | | | | | | |
| | BT-93 | | | | | | | | | | | | | | |
| Inorganic filler | Fused silica | 60 | 60 | 60 | 60 | 60 | 60 | 60 | 60 | 60 | 60 | 60 | 60 | 60 | 80 |
| catalyst | 2PZ | 0.2 | 0.2 | 0.2 | 0.2 | 0.2 | 0.2 | 0.2 | 0.2 | 0.2 | 0.2 | 0.2 | 0.1 | 0.2 | 0.15 |
| Silane compound | 6020 | 0.1 | 0.1 | 0.1 | 0.1 | 0.1 | 0.1 | 0.1 | 0.1 | 0.1 | 0.1 | 0.1 | 0.1 | 0.1 | 0.4 |
| solvent | PM | 30 | 30 | 30 | 30 | 30 | 30 | 30 | 30 | 60 | 30 | 30 | 30 | 60 | 40 |
| | MEK | 10 | 10 | 10 | 10 | 30 | 10 | 10 | 10 | 10 | 10 | 10 | 10 | 0 | 30 |
| | cyclohexanone | | | | | | | | | | | | | | |

TABLE 1-continued

| Property test | Test method | E1 | E2 | E3 | E4 | E5 | E6 | E7 | E8 | E9 | E10 | E11 | E12 | E13 | E14 |
|---|---|---|---|---|---|---|---|---|---|---|---|---|---|---|---|
| Tg | DSC | 162 | 161 | 168 | 161 | 149 | 147 | 143 | 162 | 150 | 145 | 142 | 154 | 147 | 159 |
| T288 (clad) | TMA (min) | 42 | 41 | 43 | 39 | 45 | 45 | 55 | 35 | 25 | 45 | 45 | 35 | 35 | 45 |
| S/D | dip cycles | >20 | >20 | >20 | >20 | >20 | >20 | >20 | >20 | >20 | >20 | >20 | >20 | >20 | >20 |
| PCT (3 hr) | dip 288° C., 20 s | PASS | PASS | PASS | PASS | PASS | PASS | PASS | PASS | PASS | PASS | PASS | PASS | PASS | PASS |
| P/S | Hoz Cu foil | 6.5 | 6.3 | 6.0 | 6.7 | 6.3 | 6.0 | 6.3 | 6.3 | 6.8 | 6.1 | 6.1 | 6.7 | 6.2 | 6.4 |
| Dk | 2 GHz | 4.00 | 4.10 | 4.00 | 4.20 | 4.10 | 4.10 | 4.12 | 4.15 | 4.20 | 4.10 | 4.10 | 4.10 | 4.20 | 4.05 |
| Df | 2 GHz | 0.010 | 0.010 | 0.009 | 0.010 | 0.012 | 0.012 | 0.012 | 0.009 | 0.012 | 0.011 | 0.009 | 0.009 | 0.013 | 0.009 |
| Flame retardancy | UL94 | V-0 | V-0 | V-0 | V-0 | V-0 | V-0 | V-0 | V-0 | V-0 | V-0 | V-0 | V-0 | V-0 | V-0 |

TABLE 2

| composition | | C1 | C2 | C3 | C4 | C5 | C6 | C7 | C8 | C9 | C10 | C11 | C12 | C13 | C14 |
|---|---|---|---|---|---|---|---|---|---|---|---|---|---|---|---|
| Epoxy resin | SEC-365 | 50 | 50 | 50 | 50 | 50 | 50 | 50 | 50 | 50 | 50 | 50 | 50 | 50 | |
| | HP-7200H | | | | | | | | | | | | | | 40 |
| | NC-3000 | | | | | | | | | | | | | | 60 |
| | EXA-9900 | | | | | | | | | | | | | | |
| benzoxazine resin | LZ8280 | 50 | 50 | 50 | 50 | 50 | 50 | 50 | 50 | 50 | 50 | 50 | 50 | 50 | 50 |
| | BPF-Bz | 60 | 60 | 60 | 60 | | 100 | 5 | 35 | 35 | 35 | 35 | 35 | 35 | |
| Amine hardener | DICY | 1 | 1 | | 1 | 1 | 1 | 1 | 5.2 | 0.1 | 1 | 1 | 1 | 1 | 1 |
| | DDS | | | | | | | | | | | | | | |
| dicyclo pentadiene phenol resin | PD-9110 | 20 | 20 | 30 | | 55 | 30 | 30 | 30 | 30 | 70 | 5 | 30 | 30 | 20 |
| diallyl bisphenol A resin | DABPA | 10 | 20 | | | | | | | | | | | | 10 |
| Flame retardant | PX-200 | 50 | 50 | 50 | 50 | 50 | 50 | 50 | 50 | 50 | 50 | 50 | 80 | 20 | 40 |
| | SPB-100 | | | | | | | | | | | | | | |
| | XZ92741 | | | | | | | | | | | | | | |
| | 8010 | | | | | | | | | | | | | | |
| | BT-93 | | | | | | | | | | | | | | |
| Inorganic filler | Fused silica | 60 | 60 | 60 | 60 | 60 | 60 | 60 | 60 | 60 | 60 | 60 | 60 | 60 | 60 |
| catalyst | 2PZ | 0.2 | 0.2 | 0.2 | 0.2 | 0.2 | 0.2 | 0.2 | 0.2 | 0.2 | 0.2 | 0.2 | 0.2 | 0.2 | 0.15 |
| Silane compound | 6020 | 0.1 | 0.1 | 0.1 | 0.1 | 0.1 | 0.1 | 0.1 | 0.1 | 0.1 | 0.1 | 0.1 | 0.1 | 0.1 | 0.4 |
| solvent | PM | 30 | 30 | 30 | 30 | 30 | 30 | 30 | 30 | 30 | 30 | 30 | 30 | 30 | 40 |
| | MEK cyclohexanone | 10 | 10 | 10 | 10 | 10 | 10 | 10 | 10 | 10 | 10 | 10 | 10 | 10 | 30 |

| Property test | Test method | C1 | C2 | C3 | C4 | C5 | C6 | C7 | C8 | C9 | C10 | C11 | C12 | C13 | C14 |
|---|---|---|---|---|---|---|---|---|---|---|---|---|---|---|---|
| Tg | DSC | 158 | 151 | 153 | 151 | 139 | 162 | 135 | 159 | 145 | 136 | 132 | 137 | 149 | 155 |
| T288 | TMA (min) | 18 | 18 | 18 | 15 | 50 | 12 | 35 | 3 | 30 | 60 | 20 | 25 | 25 | 25 |
| S/D | dip cycles | >20 | >20 | >20 | >20 | >20 | 18 | >20 | 15 | >20 | >20 | >20 | >20 | >20 | >20 |
| PCT(3 hr) | dip 288° C., 20 s | Fail | Fail | PASS | PASS | PASS | Fail | PASS | Fail | PASS | PASS | PASS | PASS | PASS | PASS |
| P/S | Hoz Cu foil | 6.1 | 6 | 5.3 | 6.3 | 6.5 | 6.5 | 6.5 | 6.4 | 5.7 | 6.3 | 6.2 | 6.1 | 6.1 | 6.4 |
| Dk | 2 GHz | 4.30 | 4.25 | 4.30 | 4.35 | 4.25 | 4.30 | 4.25 | 4.55 | 4.25 | 4.15 | 4.2 | 4.35 | 4.35 | 4.14 |
| Df | 2 GHz | 0.012 | 0.011 | 0.012 | 0.01 | 0.018 | 0.009 | 0.014 | 0.018 | 0.015 | 0.013 | 0.010 | 0.014 | 0.012 | 0.010 |
| Flame retardancy | UL94 | V-0 | V-0 | V-0 | V-0 | V-0 | V-0 | V-0 | V-0 | V-0 | V-0 | V-0 | V-0 | V-1 | V-0 |

CONCLUSION

In Examples 1-14, using benzoxazine resin, dicyclopentadiene phenol resin and amine hardener at the same time makes the laminate meet the requirement of heat resistance (T288, Tg, S/D), water absorption and heat resistance (PCT), peeling strength (P/S) of the copper foil, low dielectric property (Dk&Df) and flame retardancy.

As compared Example E6 with Example E7, the peeling strength (P/S) of the copper foil in Example E7 was increased due to the use of more DICY.

In comparative examples C1-C2, the use of diallyl biphenol A resin (DABPA) makes the heat resistance (T288) of the laminate significantly reduced. But Example 14 without diallyl biphenol A resin (DABPA) has a much better laminate heat resistance (T288) over Comparative example C14.

In comparative examples C3-C13, since the content of certain ingredient do not fall within the scope claimed in the present invention, C3-C13 do not meet the requirement of heat resistance (T288, Tg, S/D), water absorption and heat resistance (PCT), peeling strength (P/S) of the copper foil, low dielectric property (Dk&Df) and flame retardancy at the same time.

The above examples are preferable for the present invention, but do not intend to limit the scope of the essential technical contents. The essential technical contents were broadly defined in the claims of the present application. Any technical entities or methods completed by other people are also covered by the claims, if they are the same as that defined in the claims of the present application or an equivalent modification thereof.

All literature references cited herein are hereby incorporated by reference, just as each reference was cited independently. Moreover, it should be understood that the skilled in the art can change or modify the present invention based on the above disclosure and the equivalent arrangements are also included in the scope of the claims attached in the application.

The invention claimed is:

1. A resin composition comprising:
   (A) 100 parts by weight of epoxy resin;
   (B) from 10 to 80 parts by weight of benzoxazine resin;
   (C) from 10 to 50 parts by weight of dicyclopentadiene phenol resin; and
   (D) from 0.5 to 5 parts by weight of amine hardener;
   wherein the resin composition is free of diallyl bisphenol A (DABPA), and wherein said resin composition is capable of preparing a copper clad laminate having a glass transition temperature (Tg) measured by differential scanning calorimetry (DSC) greater than 140° C., a dielectric constant (Dk) less than about 4.3, and a dissipation factor (Df) less than about 0.013 and configured to withstand greater than 20 minutes of a heat resistance T288 capacity test by which the laminate is tested for delamination at 288° C.

2. The resin composition according to claim 1, wherein the weight ratio of said benzoxazine resin: said dicyclopentadiene phenol resin: said amine hardener is (10-60): (15-35): (0.5-3).

3. The resin composition according to claim 1, wherein the dicyclopentadiene phenol resin is selected from the compound represented by the following structural formula:

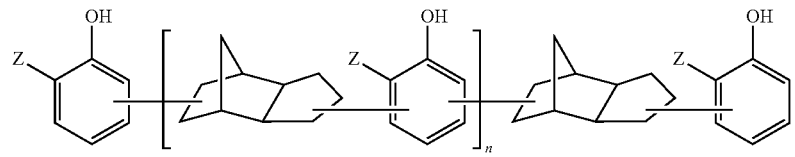

wherein n is a positive integer from 1 to 5, Z is selected from —H, —CH$_3$ or a combination thereof.

4. The resin composition according to claim 1, wherein the amine hardener is at least one selected from the group consisting of diamino diphenylsulfone, diamino diphenylmethane, diamino diphenyl ether, diamino diphenyl sulfide and dicyandiamide.

5. The resin composition according to claim 1, wherein the epoxy resin is at least one selected from the group consisting of bisphenol A epoxy resin, bisphenol F epoxy resin, bisphenol S epoxy resin, bisphenol AD epoxy resin, bisphenol A novolac epoxy resin, o-cresol novolac epoxy resin, trifunctional epoxy resin, tetrafunctional epoxy resin, dicyclopentadiene type epoxy resin, DOPO-containing epoxy resin, DOPO-HQ-containing epoxy resin, p-xylene epoxy resin, naphthalene type epoxy resin, benzopyran type epoxy resin, biphenyl novolac epoxy resin, isocyanate modified epoxy resin, phenol benzaldehyde epoxy resin and phenol aralkyl novolac epoxy resin.

6. The resin composition according to claim 1, wherein the benzoxazine resin is at least one selected from the group consisting of bisphenol A type benzoxazine resin, bisphenol F type benzoxazine resin, diamino diphenyl ether type benzoxazine resin and phenolphthalein type benzoxazine resin.

7. The resin composition according to claim 1, wherein the composition further comprises from 30 to 70 parts by weight of flame retardant, wherein the flame retardant is at least one selected from the group of halogen-free flame retardants and halogen flame retardants consisting of: bisphenol diphenyl phosphate, ammonium polyphosphate, hydroquinone-bis-(diphenyl phosphate), bisphenol A-bis-(diphenylphosphate), tris(2-carboxyethyl)phosphine, tris(isopropylchloro)phosphate, trimethyl phosphate, dimethyl methyl phosphonate, resorcinol bis(dixylenyl phosphate), phosphazene, m-phenylene methylphosphonate, melamine polyphosphate, melamine cyanurate and tri-hydroxy ethyl isocyanurate, 9,10-dihydro-9-oxa-10-phosphaphenanthrene-10-oxide (DOPO), DOPO-containing phenol resin, ethyl-bis(tetrabromophthalimide), ethane-1,2 bis(pentabromobenzene) and 2,4,6-tris(2,4,6-tribromophenoxy)-1,3,5-triazine.

8. The resin composition according to claim 1, wherein the composition further comprises inorganic fillers, curing accelerators, silane coupling agents, toughening agents, solvents or a combination thereof.

9. A prepreg made from the resin composition according to claim 1.

10. A copper clad laminate made from the prepreg according to claim 9.

11. A printed circuit board comprising the copper clad laminate according to claim 10.

12. The copper clad laminate of claim 10, wherein the copper clad laminate is configured to withstand more than 20 cycles of a solder dip test (S/D) by which the laminate is tested at a temperature of 288° C. for 10 sec/cycle.

13. The copper clad laminate of claim 10, wherein the copper clad laminate has a peeling strength (P/S) between 6 lb/in and 6.8 lb/in.

14. The copper clad laminate of claim 13, wherein the copper clad laminate is configured to withstand more than 20 cycles of a solder dip test (S/D) by which the laminate is tested at a temperature of 288° C. for 10 sec/cycle.

15. The copper clad laminate of claim 13, wherein the copper clad laminate is configured to withstand greater than 20 minutes of a heat resistance T288 capacity test by which the laminate is tested for delamination at 288° C.

\* \* \* \* \*